(12) United States Patent
Jin et al.

(10) Patent No.: US 12,493,310 B2
(45) Date of Patent: *Dec. 9, 2025

(54) LINEAR VOLTAGE REGULATOR CIRCUIT AND MULTIPLE OUTPUT VOLTAGES

(71) Applicants: TAIWAN SEMICONDUCTOR MANUFACTURING COMPANY, LTD., Hsinchu (TW); TSMC CHINA COMPANY LIMITED, Shanghai (CN)

(72) Inventors: Yong-Liang Jin, Shanghai (CN); Ya-Qi Ma, Shanghai (CN); Wei Li, Shanghai (CN); Di Fan, Shanghai (CN)

(73) Assignees: TAIWAN SEMICONDUCTOR MANUFACTURING COMPANY, LTD., Hsinchu (TW); TSMC CHINA COMPANY LIMITED, Shanghai (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/590,880

(22) Filed: Feb. 28, 2024

(65) Prior Publication Data
US 2024/0201719 A1 Jun. 20, 2024

Related U.S. Application Data

(63) Continuation of application No. 18/156,317, filed on Jan. 18, 2023, now Pat. No. 11,947,372, which is a (Continued)

(30) Foreign Application Priority Data

Jan. 6, 2021 (CN) .......................... 202110014343.3

(51) Int. Cl.
*G05F 1/565* (2006.01)
*G05F 1/46* (2006.01)

(52) U.S. Cl.
CPC .............. *G05F 1/565* (2013.01); *G05F 1/462* (2013.01)

(58) Field of Classification Search
CPC .................................................. G05F 1/46–565
See application file for complete search history.

(56) References Cited

U.S. PATENT DOCUMENTS 4,730,122 A   3/1988   Dreibelbis et al.
5,373,477 A  12/1994   Sugibayashi
(Continued)

FOREIGN PATENT DOCUMENTS

EP   2 477 459 B1    1/2016
JP   2006-204090 A   8/2006
(Continued)

OTHER PUBLICATIONS

C. Stanescu, C. Dinca and R. Iacob, "Soft-start low voltage CMOS LDO," CAS 2013 (International Semiconductor Conference), Sinaia, Romania, 2013, pp. 185-188 (Year: 2013).*

(Continued)

*Primary Examiner* — Peter M Novak
(74) *Attorney, Agent, or Firm* — Maschoff Brennan

(57) ABSTRACT

A device includes a voltage regulator circuit configured to pull up a voltage at an output terminal to equal to half of a supply voltage; multiple first transistors coupled between the output terminal and a voltage terminal providing the supply voltage; and a control circuit configured to pull down gate voltages of the first transistors from the supply voltage to a voltage level between the supply voltage and a ground voltage at a first time. The first transistors are configured to pull up the voltage at the output terminal to the supply voltage at a second time.

20 Claims, 10 Drawing Sheets

Related U.S. Application Data continuation of application No. 17/193,681, filed on Mar. 5, 2021, now Pat. No. 11,561,562.

(56) References Cited

U.S. PATENT DOCUMENTS

| | | | |
|---|---|---|---|
| 6,897,638 B2 | 5/2005 | Miyanaga | |
| 7,212,067 B2 | 5/2007 | Pasternak | |
| 7,886,173 B2 | 2/2011 | Krieger et al. | |
| 8,072,196 B1 | 12/2011 | Li | |
| 9,098,101 B2 | 8/2015 | Naidu et al. | |
| 9,383,760 B2* | 7/2016 | Porras | G05F 1/468 |
| 11,561,562 B2* | 1/2023 | Jin | G05F 1/565 |
| 11,947,372 B2* | 4/2024 | Jin | G05F 1/468 |
| 2004/0008015 A1 | 1/2004 | Pons | |
| 2004/0100235 A1 | 5/2004 | Lee | |
| 2006/0158165 A1 | 7/2006 | Inn et al. | |
| 2007/0216383 A1 | 9/2007 | Al-Shyoukh et al. | |
| 2008/0094264 A1 | 4/2008 | Lin | |
| 2014/0002049 A1 | 1/2014 | Schrom et al. | |
| 2015/0042296 A1 | 2/2015 | Cheng et al. | |
| 2015/0077076 A1 | 3/2015 | Bhattad | |
| 2015/0323946 A1 | 11/2015 | Chang et al. | |
| 2016/0116927 A1 | 4/2016 | Chen | |
| 2016/0147240 A1* | 5/2016 | Lan | G05F 1/565 323/280 |
| 2019/0079575 A1 | 3/2019 | Hanson et al. | |
| 2019/0379372 A1 | 12/2019 | Mou et al. | |
| 2020/0274530 A1* | 8/2020 | Lueders | H02M 1/08 |

FOREIGN PATENT DOCUMENTS

| | | |
|---|---|---|
| KR | 10-2017-0035310 A | 3/2017 |
| TW | M313378 U | 6/2007 |
| TW | I372326 B | 9/2012 |
| TW | 201611490 A | 3/2016 |
| TW | 201616795 A | 5/2016 |
| TW | 201739161 A | 11/2017 |

OTHER PUBLICATIONS

KR Office Action dated Jun. 16, 2022 as received in Application No. 10-2021-0057759.

* cited by examiner

1000

1010 — IN RESPONSE TO AN OUTPUT VOLTAGE HAVING A FIRST VOLTAGE LEVEL, A LOGIC STATE OF A FIRST CONTROL SIGNAL BEING CHANGED FROM A FIRST LOGIC STATE TO A SECOND LOGIC STATE AT A TRANSITION TIME OF A POWER SUPPLY GENERATOR

1020 — RECEIVING AT A FIRST TERMINAL OF A RESISTIVE UNIT A SECOND CONTROL SIGNAL ASSOCIATED WITH THE FIRST CONTROL SIGNAL AND GENERATING AT A SECOND TERMINAL OF THE RESISTIVE UNIT A THIRD CONTROL SIGNAL TO PULL DOWN A GATE VOLTAGE OF AT LEAST ONE FIRST TRANSISTOR ACCORDING TO THE THIRD CONTROL SIGNAL, IN WHICH A CAPACITIVE UNIT IS COUPLED TO THE SECOND TERMINAL OF THE RESISTIVE UNIT

1030 — PULLING UP, BY THE AT LEAST ONE FIRST TRANSISTOR, THE OUTPUT VOLTAGE TO HAVE A SECOND VOLTAGE LEVEL DIFFERENT FROM THE FIRST VOLTAGE LEVEL AT A TURN-ON TIME OF THE AT LEAST ONE FIRST TRANSISTOR

FIG. 10

LINEAR VOLTAGE REGULATOR CIRCUIT AND MULTIPLE OUTPUT VOLTAGES

CROSS REFERENCE

This application is a continuation of U.S. application Ser. No. 18/156,317, filed on Jan. 18, 2023, which is a continuation of U.S. application Ser. No. 17/193,681, filed on Mar. 5, 2021, now U.S. Pat. No. 11,561,562, issued Jan. 24, 2023, which claims priority to China Application Serial Number 202110014343.3 filed on Jan. 6, 2021, which is herein incorporated by reference in its entirety.

BACKGROUND

In dual mode system, for example, secure digital card hosts and a reduced gigabit media-independent interface (RGMII), input output buffer requires to support power modes operating with two different voltages, such as 3.3 Volts and 1.8 Volts. In some approaches, the mid-bias supply is utilized to ensure the safety of the circuit. However, during switching between the operation modes, occurrence of spike currents impacts the reliability of power supply generators.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a flow chart of a method of operating a power supply generator, in accordance with some embodiments.

DETAILED DESCRIPTION

Figure 1:
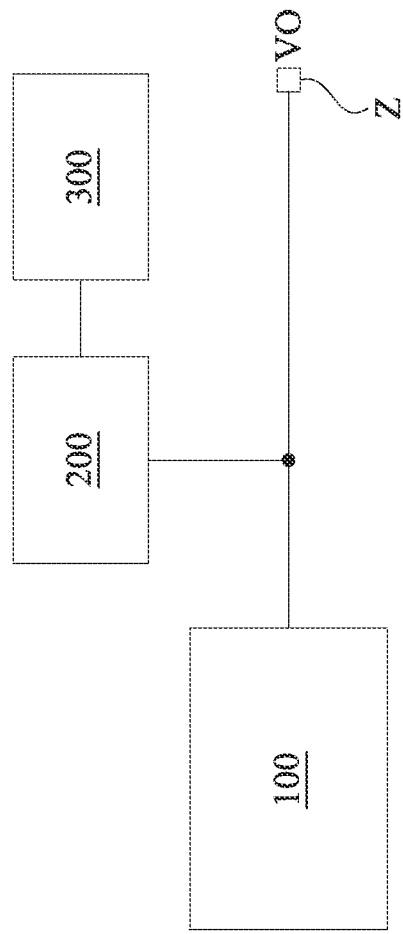
FIG. 1 is a schematic diagram of a power supply generator, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of a power supply generator 10, in accordance with some embodiments. As shown in FIG. 1, the power supply generator 10 includes a voltage regulator circuit 100, a power switch circuit 200, and a control circuit 300. The voltage regulator circuit 100 and the power switch circuit 200 are coupled at the output terminal Z. In some embodiments, the voltage regulator circuit 100 and the power switch circuit 200 generate the output signal VO at the output terminal Z. The power switch circuit 200 is further coupled to the control circuit 300. In some embodiments, the power switch circuit 200 operates in response to control signals from the control circuit 300 or co-operates with the control circuit 300 to generate the output signal VO.

Figure 2:
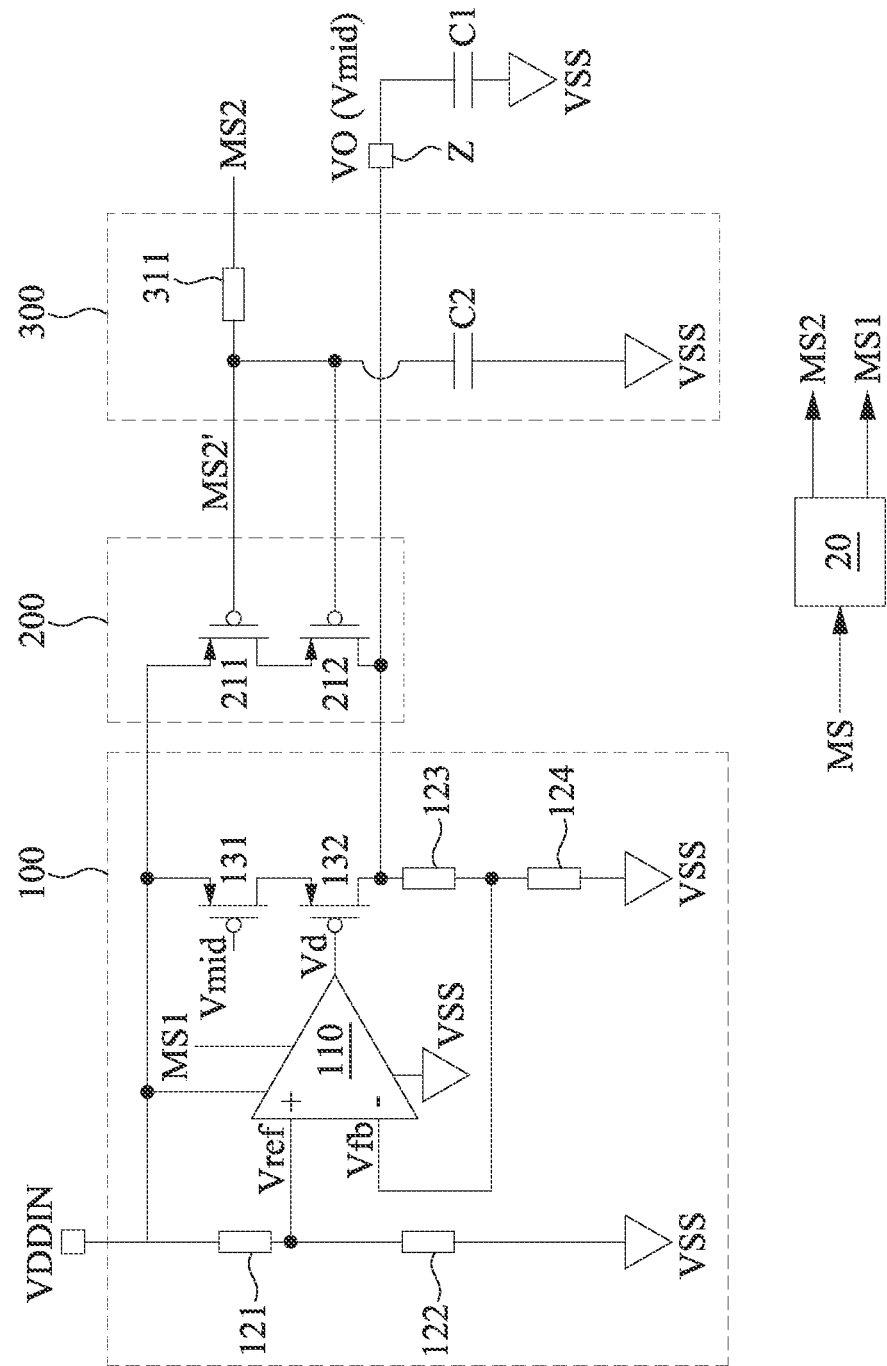
FIG. 2 is a detailed schematic diagram of the power supply generator corresponding to one in FIG. 1, in accordance with various embodiments.

Reference is now made to FIG. 2. FIG. 2 is a detailed schematic diagram of the power supply generator 10 corresponding to one in FIG. 1, in accordance with various embodiments. With respect to the embodiments of FIG. 1, like elements in FIG. 2 are designated with the same reference numbers for ease of understanding.

In some embodiments, the power supply generator 10 further includes a selection circuit 20. The selection circuit 20 is configured to generate, in response to the control signal MS, control signals MS1 and MS2 that have different logic values. For instance, when the control signal MS has a logic value 1 (i.e., a logic state being high), the control signal MS1 has the logic value 1 and the control signal MS2 has a logic value 0 (i.e., a logic state being low). Similarly, when the control signal MS has the logic value 0, the control signal MS1 has the logic value 1 and the control signal MS2 has the logic value 1.

In some embodiments, the power supply generator 10 has modes with different operational voltages. For instance, in a first voltage mode (i.e., under an overdrive condition), the supply voltage VDDIN is, for instance, 3.3 Volts. The voltage regulator circuit 100 is activated in response to the control signal MS1 having the logic value 0 and outputs the output signal VO; meanwhile, the power switch circuit 200 is turned off in response to the control signal MS2 having the logic value 1 to protect the circuit. Moreover, in a second voltage mode, the supply voltage VDDIN is, for instance, 1.8 Volts. Firstly, the voltage regulator circuit 100 remains activated in response to the control signal MS1 having the logic value 0, and the power switch circuit 200 is turned off in response to the control signal MS2 having the logic value 1. Subsequently, the logic state of the control signal MS changes from the logic value 0 to the logic value 1, and the control signals MS1 and MS2 correspondingly have the logic value 1 and the logic value 0 respectively. Hence, the voltage regulator circuit 100 is turned off and the power switch circuit 200 is activated to output the output signal VO. The detailed configurations of operations of the power supply generator 10 will be discussed in the following paragraphs. Values of the supply voltage VDDIN given above are for the illustrative purposes, and are not configured to limit the embodiments of the present disclosure. Person having ordinary skills can manipulate the value of the supply voltage VDDIN based on the actual practice.

As shown in FIG. 2, the voltage regulator circuit 100 includes an amplifier 110, resistive units 121-124 and (P-type) transistors 131-132. For the connection relationship, the resistive units 121-122 are coupled in series between the supply voltage terminal VDDIN and the supply voltage terminal VSS. The supply voltage terminal VDDIN is referred to as to provide the supply voltage VDDIN, and the supply voltage terminal VSS is referred to as to provide the supply voltage VSS. The resistive units 123-124 are coupled in series the supply voltage terminal VSS and the output terminal Z. An input terminal (denoted by "+") of the amplifier 110 receives a reference voltage Vref from a node between the resistive units 121-122, and another input terminal (denoted by "−") of the amplifier 110 receives a feedback voltage Vfb from a node between the resistive unit 123-124. The amplifier 110 is coupled between the supply voltage terminal VDDIN and the supply voltage terminal VSS, and is driven by the supply voltages VDDIN and VSS. In some embodiments, the amplifier 110 outputs, in response to the control signal MS1, a signal Vd to the gate of the transistor 132. The transistors 131-132 are coupled in series between the supply voltage terminal VDDIN and the output terminal Z. The gate of the transistor 131 receives the output signal VO having an output voltage Vmid. More specifically, the source of the transistor 131 is coupled to the supply voltage terminal VDDIN, the drain of the transistor 131 is coupled to the source of the transistor 132, and the drain of the transistor 132 is coupled the output terminal Z, in which a capacitive unit C1 included in the power supply generator 10 is coupled between the output terminal Z and the supply voltage terminal VSS.

In some embodiments, the voltage regulator circuit 100 is implemented by a low dropout regulator, and the amplifier 110 is implemented by an error amplifier.

For operation, when the control signal MS1 has the logic value 0 and the control signal MS2 has the logic value 1, the voltage regulator circuit 100 is activated and the power switch circuit 200 is turned off. The amplifier 110 compares, in response to the control signal MS1, the feedback voltage Vfb with the reference voltage Vref. A deviation between the feedback voltage Vfb and the reference voltage Vref is amplified by the amplifier 110 and the signal Vd is outputted. The signal Vd controls a gate voltage of the transistor 132, and further controls and stabilizes the output signal VO and the output voltage Vmid thereof. For instance, when the output voltage Vmid drops, the deviation between the reference voltage Vref and the feedback voltage Vfb increases, the amplifier 110 outputs the signal Vd to reduce the voltage crossing the transistor 132, and therefore the output voltage Vmid rises. Nonetheless, when the output voltage Vmid exceeds a required setting value, the amplifier 110 outputs the signal Vd to raise the voltage crossing the transistor 132, and accordingly the output voltage Vmid declines.

In some embodiments, in the first voltage mode (i.e., the supply voltage VDDIN being approximately 3.3 Volts), when the voltage regulator circuit 100 is just about to power up and begins to output the output signal VO, the output signal VO is charged until the output voltage Vmid approximately equals to a half of the supply voltage VDDIN (VDDIN/2). Subsequently, the voltage regulator circuit 100 keeps regulating the voltage. In some embodiments, the supply voltage VDDIN ranges from about 2.7 Volts to about 3.3 Volts, the output voltage Vmid ranges between about 1.35 Volts and 1.65 Volts.

With continued reference to FIG. 2, the power switch circuit 200 includes transistors 211-212. The transistors 211-212 are coupled in series with each other between the supply voltage terminal VDDIN and the output terminal Z. More specifically, the source of the transistor 211 is coupled to the supply voltage terminal VDDIN. The drain of the transistor 211 is coupled to the source of the transistor 212. The source of transistor 212 is coupled to the output terminal Z. Gates of the transistors 211-212 are coupled to the control circuit 300.

In some embodiments, the transistors 211-212 are P-type transistors. In various embodiments, the transistors 211-212 are metal oxide semiconductor field-effect transistor (MOSFET) transistors.

The control circuit 300 includes a resistive unit 311 and a capacitive unit C2. As shown in FIG. 2, the resistive unit 311 has a first terminal configured to receive the control signal MS2 and outputs a control signal MS2' from its second terminal. The capacitive unit C2 is coupled between the second terminal of the resistive unit 311 and the supply voltage terminal VSS. The gates of the transistors 211-212 are coupled to the second terminal of the resistive unit 311. Alternatively stated, the power switch circuit 200 is coupled to the capacitive unit C2 and the resistive unit 311 at the second terminal of the resistive unit 311.

In some embodiments, the resistive unit 311 is implemented by a resistive unit of million ohm (MΩ). The capacitive unit C2 is implemented by a capacitive unit of picofarad (pF). Compared with the capacitive unit C2, the capacitive unit C1 is implemented by a capacitive unit of microfarad (μF).

Figure 3A:
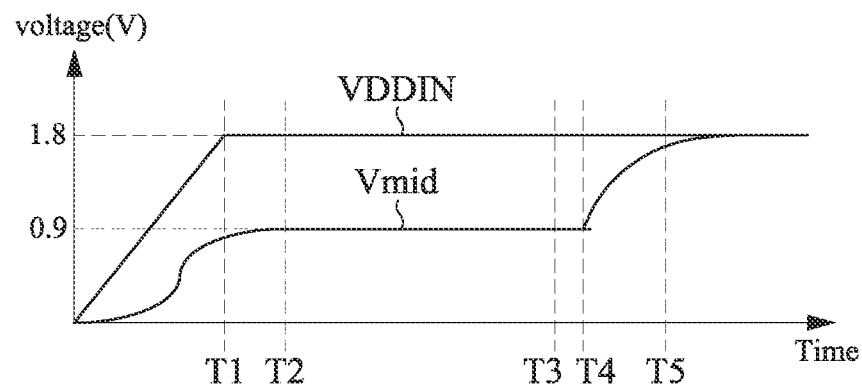
FIG. 3A is a schematic waveform diagram of a supply voltage and an output voltage in the power supply generator of FIG. 1, in accordance with various embodiments.
Figure 3B:
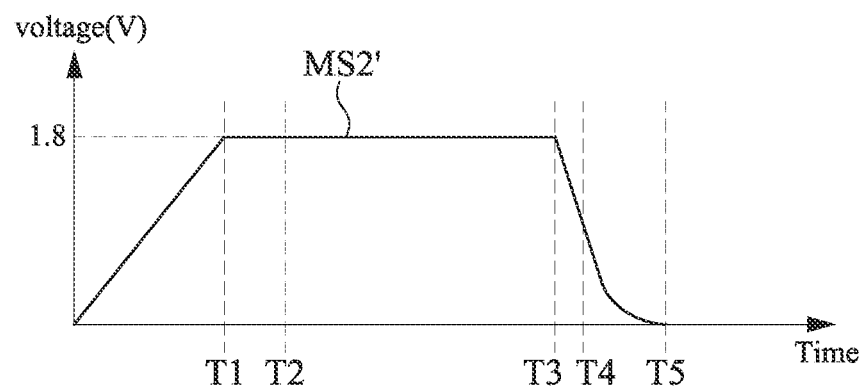
FIG. 3B is a schematic waveform diagram of a control signal in the power supply generator of FIG. 1, in accordance with various embodiments.
Figure 3C:
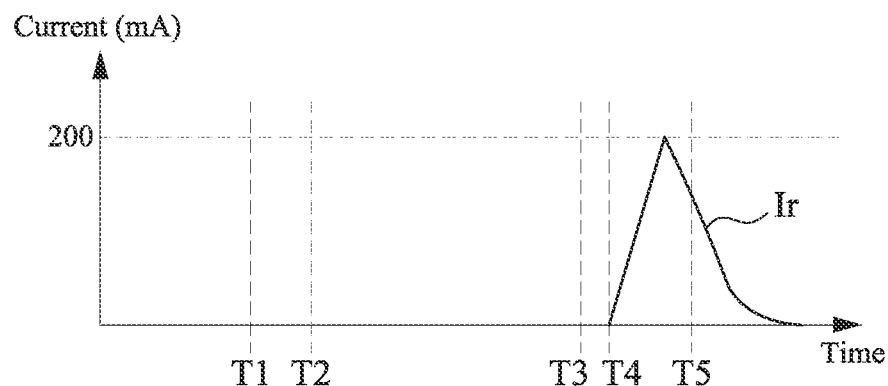
FIG. 3C is a schematic waveform diagram of a spike current in the power supply generator of FIG. 1, in accordance with various embodiments.

The detailed configurations of the operation of the power switch circuit 200 and the control circuit 300 will be discussed with reference to FIGS. 3A-3C. FIG. 3A is a schematic waveform diagram of the supply voltage VDDIN and the output voltage Vmid in the power supply generator 10 of FIG. 1, in accordance with various embodiments. FIG. 3B is a schematic waveform diagram of the control signal MS2' in the power supply generator 10 of FIG. 1, in accordance with various embodiments. FIG. 3C is a schematic waveform diagram of a spike current Ir in the power supply generator 10 of FIG. 1, in accordance with various embodiments.

Reference is made to FIG. 2 and FIGS. 3A-3B. In the second voltage mode (i.e., the supply voltage VDDIN being equal to 1.8 Volts), as shown in FIG. 3A, the supply voltage VDDIN incrementally increases and reaches about 1.8 Volts at the time T1. The voltage regulator circuit 100 is activated and charges the output terminal Z. In the meanwhile, as shown in FIG. 3B, the control signal MS2' is about 1.8 Volts (i.e., the logic value 1) at the time T1. Accordingly, the transistors 211-212 in the power switch circuit 200 are turned off.

At the time T2, the output voltage Vmid is stabilized at about 0.9 Volts, as shown in FIG. 3A. Alternatively stated, the output voltage Vmid equals to the half of the supply voltage VDDIN (VDDIN/2).

Subsequently, at the time T3, the logic state of the control signal MS changes to be the logic value 1, and the voltage regulator circuit 100 is correspondingly turned off in response to the control signal MS1 altered to be the logic value 1, while the control signal MS2 is correspondingly altered to the logic value 0. At the same time, as shown in FIG. 3B, because of the resistive unit 311 and the capacitive unit C2 in the control circuit 300, a voltage level of the control signal MS2' starts decreasing gradually between the time T3 and the time T4. Alternatively stated, the control circuit 300 is configured to introduce a time difference between the time T3 and T4, so that the control signal MS2' declines slowly in the duration of time difference.

At the time T4, because the difference between the decreased voltage level of the control signal MS2' (i.e., the gate voltage of the transistors 211-212) and the supply voltage VDDIN is greater than the threshold voltage of the transistors 211-212, the transistors 211-212 start being turned on and transmit the supply voltage VDDIN to the output terminal Z in order to charge the output voltage Vmid. As the transistors 211-212 are turned on, a spike current Ir occurs at the output terminal Z. In addition, because the voltage level of the control signal MS2' decreases in a low pace, at the time T4, the transistors 211-212 are just turned on and does not provide intensive driving ability, as the output voltage Vmid not increasing in a fast speed.

Furthermore, at the time T5, as shown in FIG. 3B, the voltage level of the control signal MS2' continues declining to about 0 Volt. Conductive channels of the transistor 211-212 are generated and the driving ability is enhanced accordingly. As shown in FIG. 3A, the output voltage Vmid is charged to have a level of the supply voltage VDDIN. In some embodiments, during the second voltage mode, when the supply voltage VDDIN ranges from about 1.62 Volt to about 1.98 Volts, the output voltage Vmid ranges from about 1.62 Volts to about 1.98 Volts.

In some approaches, components corresponding to the power switch circuit 200 of the present disclosure, are turned on rapidly, and it causes a significant spike current at the output terminal, for example, with about 300 mA. However, with the configuration of the present disclosure, as shown in FIG. 3C, the power switch circuit 200 is turned on slowly in response to the control signal from the control circuit 300, the spike current at the output terminal Z decrease at about 33%, for example, approximately 200 mA.

The configurations of FIGS. 1-3C are given for illustrative purposes. Various implements are within the contemplated scope of the present disclosure. For example, in some embodiments, instead of including two transistors, the power switch circuit 200 includes a single transistor.

Figure 4:
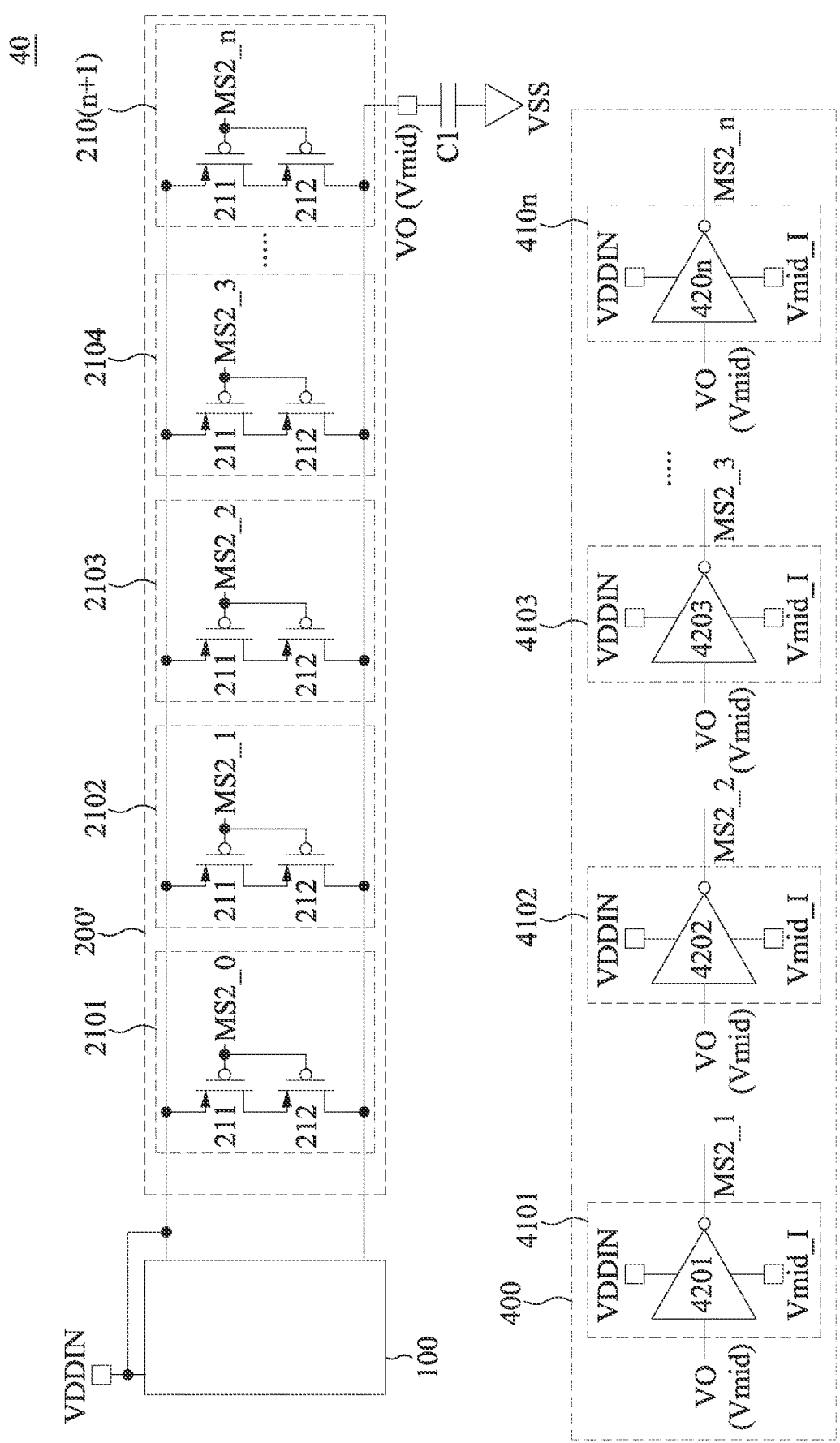
FIG. 4 is a detailed schematic diagram of a power supply generator corresponding to one in FIG. 1, in accordance with another embodiment.

Reference is now made to FIG. 4. FIG. 4 is a detailed schematic diagram of a power supply generator 40 corresponding to one in FIG. 1, in accordance with another embodiment. With respect to the embodiments of FIGS. 1-3C, like elements in FIG. 4 are designated with the same reference numbers for ease of understanding. The specific operations of similar elements, which are already discussed in detail in above paragraphs, are omitted herein for the sake of brevity.

Compared with FIG. 2, instead of having the power switch circuit 200, the power supply generator 40 includes a power switch circuit 200' and a detection circuit 400. Similarly, the power switch circuit 200' is coupled between the supply voltage terminal VDDIN and the output terminal Z.

As shown in FIG. 4, the power switch circuit 200' further includes multiple switching circuits 2101-210($n$+1). In some embodiments, the switching circuits 2101-210($n$+1) are configured with respect to, for example, the series-coupled transistors 211-212 in the power switch circuit 200. The switching circuits 2101-210($n$+1) are coupled in parallel between the supply voltage terminal VDDIN and the output terminal Z. Each of the switching circuit 2101-210(n+1) includes the transistors 211-212 coupled with each other in series.

The switching circuits 2101-210(n+1) are turned on or off in response to the control signals MS2_0-MS2_n. In some embodiments, the control signal MS2_0 is configured with respect to, for example, the control signal MS2 in FIG. 2. Accordingly, the transistors 211-212 of the switching circuit 2101 are turned on in response to the control signal MS2_0.

Subsequently, as shown in FIG. 4, the detection circuit 400 includes multiple inverter units 4101-410n. In some embodiments, the inverter unit 4101-410n include the inverters 4201-420n. The inverters 4201-420n cooperate with the supply voltage VDDIN and the voltage Vmid_I. In the embodiments shown in FIG. 4, the voltage Vmid_I has a voltage level of the supply voltage VSS.

For illustration, each of the inverters 4201-420n is configured to generate, based on the output voltage Vmid, one of the control signals MS2_1-MS2_n to turn on the transistors 211-212 in one of the rest switching circuits 2102-210(n+1) in the switching circuits 2101-210(n+1). For instance, as shown in FIG. 4, the inverter 4201 generates the control signal MS2_1 in response to the output signal VO having the output voltage Vmid, and the gates of the transistors 211-212 in the switching circuit 2102 are coupled with each other, and the transistors 211-212 are turned on or off in response to the control signal MS2_1. The configurations of the switching circuits 2102-210(n+1) are similar to that of the switching circuit 2102 and the control signal MS2_1. Hence, the repetitious descriptions are omitted here.

In some embodiments, threshold voltages of the inverters 4201-420n are different from each other. Alternatively stated, the inverters 4201-420n generate at different timings the control signals MS2_1-MS2_n having the logic state for turning on the transistors 211-212. The operation of the power supply generator 40 will be discussed in the following paragraphs with reference to FIGS. 5A-5C.

Figure 5A:
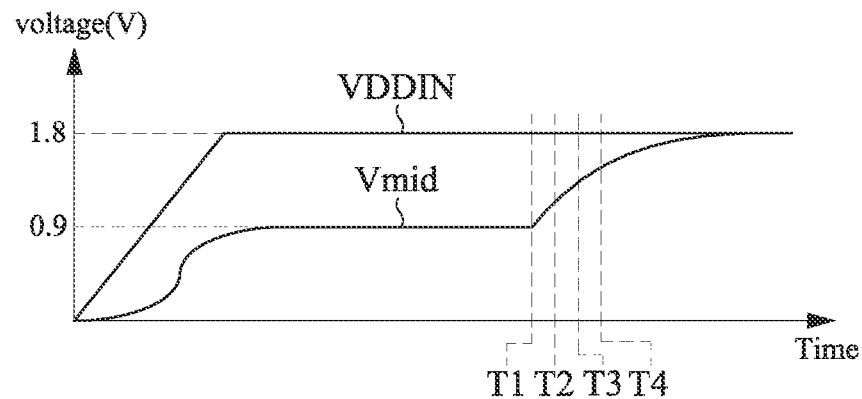
FIG. 5A is a schematic waveform diagram of a supply voltage and an output voltage in the power supply generator of FIG. 4, in accordance with various embodiments.
Figure 5B:
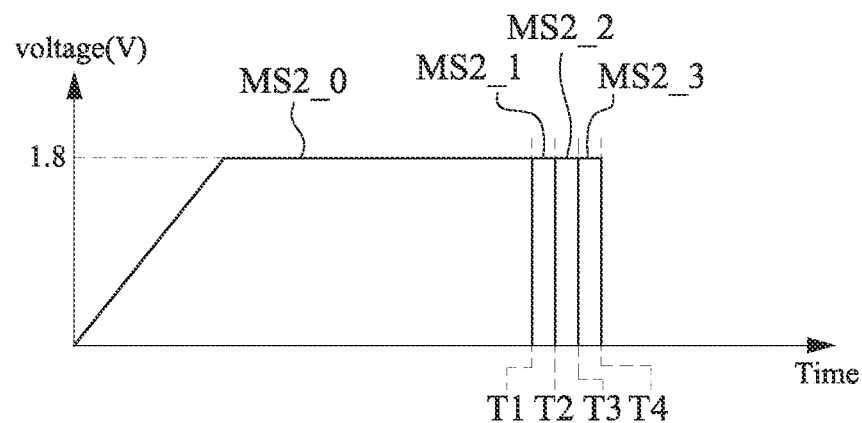
FIG. 5B is a schematic waveform diagram of control signals in the power supply generator of FIG. 4, in accordance with various embodiments.
Figure 5C:
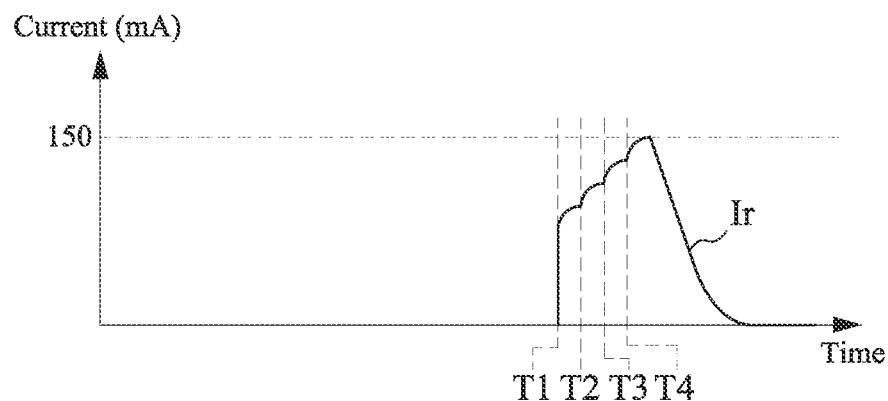
FIG. 5C is a schematic waveform diagram of a spike current in the power supply generator of FIG. 4, in accordance with various embodiments.

Reference is now made to FIGS. 5A-5C. FIG. 5A is a schematic waveform diagram of the supply voltage VDDIN and the output voltage Vmid in the power supply generator 40 of FIG. 4, in accordance with various embodiments. FIG. 5B is a schematic waveform diagram of the control signals MS2_0-MS2_3 in the power supply generator 40 of FIG. 4, in accordance with various embodiments. FIG. 5C is a schematic waveform diagram of the spike current Ir in the power supply generator 40 of FIG. 4, in accordance with various embodiments. For the sake of simplicity, merely are the control signals MS2_0-MS2_3 taken for illustrating the operation of the power supply generator 40. The configurations of the control signal MS2_0-MS2_n are similar to the control signal MS2_0-MS2_3. Hence, the repetitious descriptions are omitted here.

Before the time T1, the output terminal Z has been charged to have a voltage level equal to half of the supply voltage VDDIN, as shown in FIG. 5A.

Then, at the time T1, the logic state of the control signal MS changes to the logic value 1, the voltage regulator circuit 100 is correspondingly turned off in response to the control signal MS1 turning to have the logic 1. The control signal MS2_0 turns to be the logic 0, as shown in FIG. 5B. In the meanwhile, the switching circuit 2101 in FIG. 4 begins to be turned on to charge the output terminal Z. Because the switching circuit 2101 is turned on, the spike current Ir occurs at the output terminal Z.

At the time T2, in some embodiments, the pulled-up output voltage Vmid is fed back to the detection circuit 400. When the output voltage Vmid is greater than the threshold voltage of the inverter 4201, the inverter 4201 is configured to invert the output signal VO having the logic value 1 to output the control signal MS2_1 having the logic value 0. Alternatively stated, the logic state of the control signal MS2_1 alters from the logic value 1 to the logic value 0. Accordingly, the switching circuit 2102 in FIG. 4 begins to be turned on to charge the output terminal Z. Because the switching circuit 2102 is turned on, the spike current Ir increases, as shown in FIG. 5C.

Similarly, at the time T3, the pulled-up output voltage Vmid is continuously fed back to the detection circuit 400. When the output voltage Vmid is greater than the threshold voltage of the inverter 4202, the inverter 4202 is configured to invert the output signal VO having the logic value 1 to output the control signal MS2_2 having the logic value 0. Alternatively stated, the logic state of the control signal MS2_2 alters from the logic value 1 to the logic value 0. Accordingly, the switching circuit 2103 in FIG. 4 begins to be turned on to charge the output terminal Z. Because the switching circuit 2103 is turned on, the spike current Ir increases, as shown in FIG. 5C. Based on the mentioned above, in some embodiments, the threshold voltage of the inverter 4202 is greater than that of the inverter 4201.

Subsequently, at the time T4, the pulled-up output voltage Vmid is continuously fed back to the detection circuit 400. When the output voltage Vmid is greater than the threshold voltage of the inverter 4203, the inverter 4203 is configured to invert the output signal VO having the logic value 1 to output the control signal MS2_3 having the logic value 0. Alternatively stated, the logic state of the control signal MS2_3 alters from the logic value 1 to the logic value 0. Accordingly, the switching circuit 2104 in FIG. 4 begins to be turned on to charge the output terminal Z. Because the switching circuit 2104 is turned on, the spike current Ir increases, as shown in FIG. 5C. Based on the mentioned above, in some embodiments, the threshold voltage of the inverter 4203 is greater than that of the inverters 4201-4202.

In some approaches, as aforementioned, massive spike current occurs at the output terminal, for example, of about 300 mA. On the contrary, with the configurations of the present disclosure, as shown in FIG. 5C, because the power switch circuit 200 is turned on gradually in response to the control signals from the detection circuit 400, the spike current at the output terminal Z shrinks by about 50%, for example, being about 150 mA.

The configurations of FIGS. 4-5C are given for illustrative purposes. Various implements are within the contemplated scope of the present disclosure. For example, in some embodiments, the power supply generator 40 includes the control circuit 300 in FIG. 2, and the control signals MS2_1-MS2_n are inputted into the resistive unit 311 of the control circuit 300 and then inputted into the switching circuits 2102-210(n+1).

In some embodiments, the detection circuit 400 is referred to as the control circuit, and generates, in response to the output signal VO, the control signals MS2_1-MS2_n to the switching circuits 2102-210(n+1), in which when the voltage regulator circuit 100 of FIG. 4 are turned off at the time T1 in FIG. 5C, the detection circuit 400 turns on one of the switching circuits 2102-210(n+1) by one of the control signals MS2_1-MS2_n at a timing different from the time T1.

For instance, the inverter 4202 of the detection circuit 400 is configured to receive the output signal VO and to generate the control signal MS2_2. Then, the transistors 211-212 of the switching circuit 2103 are turned on in response to the control signal MS2_2 to pull up the output voltage Vmid.

Continued on the embodiments mentioned above, the inverter 4202 of the detection circuit 400 is configured to receive the pulled-up output voltage Vmid and to generate the control signal MS2_3. Further, the transistors 211-212 of the switching circuit 2104 are turned on in response to the control signal MS2_3 to pull up the output voltage Vmid.

Figure 6:
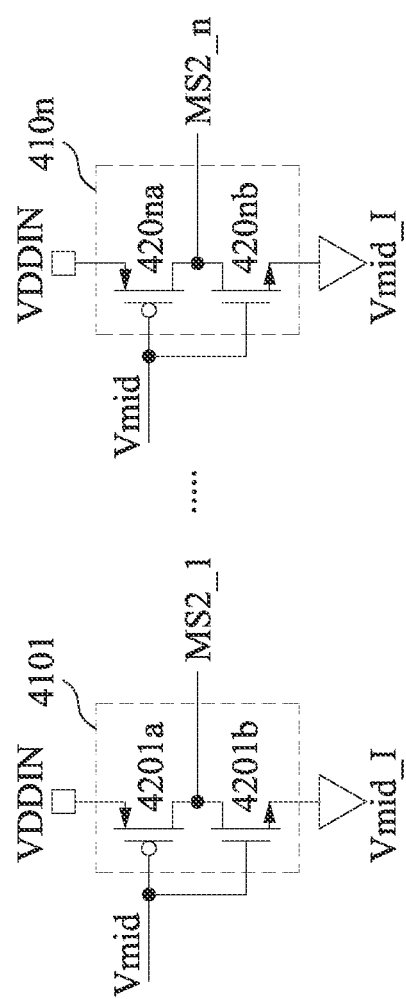
FIG. 6 is a detailed schematic diagram of a detection circuit corresponding to one in FIG. 4, in accordance with some embodiments.

Reference is now made to FIG. 6. FIG. 6 is a detailed schematic diagram of a detection circuit 400 corresponding to one in FIG. 4, in accordance with some embodiments. With respect to the embodiments of FIGS. 1-5C, like elements in FIG. 6 are designated with the same reference numbers for ease of understanding.

As shown in FIG. 6, the inverter unit 4101 corresponding to that of FIG. 4 includes the transistors 4201$a$-4201$b$, in which the transistor 4201$a$ is P-type transistor and the transistor 4201$b$ is N-type transistor. Gates of the transistors 4201$a$-4201$b$ are coupled with each other and receive the output voltage Vmid. The source of the transistor 4201$a$ is coupled to the supply voltage terminal VDDIN, and the drain thereof is coupled to the drain of the transistor 4201$b$. The source of the transistor 4201$b$ is coupled to the voltage terminal Vmid_I (i.e., proving the voltage Vmid_I). The inverter unit 4101 outputs the control signal MS2_1 at the drains of the transistors 4201$a$-4201$b$. The configurations of the inverter units 4102-410$n$ are similar to the inverter unit 4101 and the transistor 4201$a$-4201$b$. Hence, the repetitious descriptions are omitted here.

In some embodiments, the transistors 4201$a$-4201$b$ are implemented by a plurality of P-type transistors or N-type transistors. The threshold voltage of the inverter 4201 is manipulated by utilizing different ratio of P-type transistors and N-type transistors in the inverter units or the P-type transistors and the N-type transistors being made in various manufacturing processes. The configurations of the inverter unit 4102-410$n$ are similar to the inverter unit 4101 and the transistor 4201$a$-4201$b$. Hence, the repetitious descriptions are omitted here.

Figure 7:
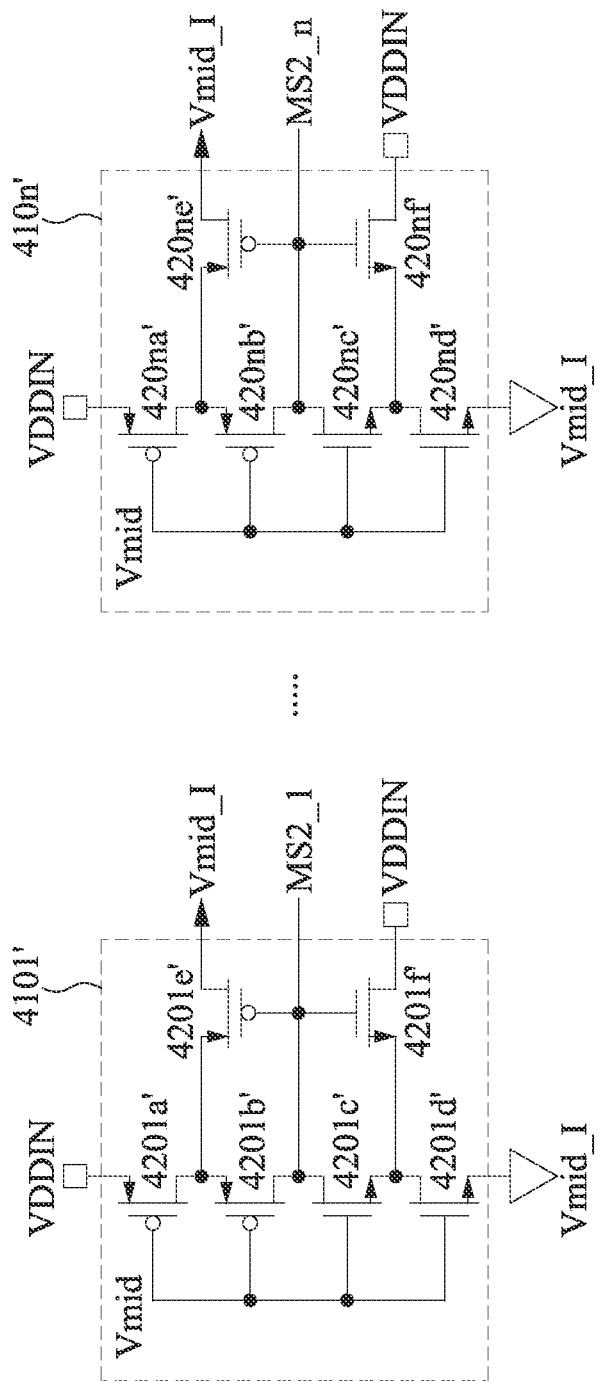
FIG. 7 is a detailed schematic diagram of a detection circuit corresponding to one in FIG. 4, in accordance with another embodiment.

Reference is now made to FIG. 7. FIG. 7 is a detailed schematic diagram of a detection circuit 400 corresponding to one in FIG. 4, in accordance with another embodiment. With respect to the embodiments of FIGS. 1-6, like elements in FIG. 2 are designated with the same reference numbers for ease of understanding.

In some embodiments, the inverter unit 4101' corresponding to the inverter unit 4101 of FIG. 4 includes a Schmitt trigger inverter including transistors 4201$a$'-4201$f$'. The transistors 4201$a$'-4201$b$' and 4201$e$' are P-type transistors, and the transistors 4201$c$'-4201$d$' and 4201$f$' are N-type transistors. Specifically, the transistors 4201$a$'-4201$d$' are coupled in series between the supply voltage terminal VDDIN and the voltage terminal Vmid_I, and the gates thereof are coupled with each other and configured to receive the output voltage Vmid. The source of the transistor 4201$e$' is coupled between the transistors 4201$a$'-4201$b$', the gate thereof is coupled to the voltage terminal Vmid_I. The gates of the transistors 4201$e$' and 4201$f$' are coupled between the transistors 4201$b$'-4201$c$' and output the control signal MS2_1. The source of the transistor 4201$f$' is coupled between the transistors 4201$c$'-4201$d$', and the drain thereof is coupled the supply voltage terminal VDDIN. The configurations of the inverter units 4101'-410$n$' are similar to the inverter unit 4101' and the transistors 4201$a$'-4201$f$'. Hence, the repetitious descriptions are omitted here.

In some embodiments, the threshold voltages of the inverters in the inverter units 4101'-410$n$' are different from each other.

In some embodiments, during the first voltage mode (i.e., the supply voltage VDDIN equals to about 3.3 Volts), the voltage Vmid_I is equal to the output voltage Vmid. Accordingly, the control signals MS2_1-MS2_$n$ continuously have a high logic value (i.e., the logic value 1) and all of the switching circuits 2102-210($n$+1) are turned off. Conversely, during the second voltage mode (i.e., the supply voltage VDDIN equals to about 1.8 Volts), the voltage Vmid_I is equal to the supply voltage VSS or a ground voltage.

The configurations of FIGS. 6-7 are given for illustrative purposes. Various implements are within the contemplated scope of the present disclosure. For example, in some embodiments, inverters (not as those in the embodiments in FIGS. 6-7) having different threshold voltages are implemented in the detection circuit 400.

Figure 8:
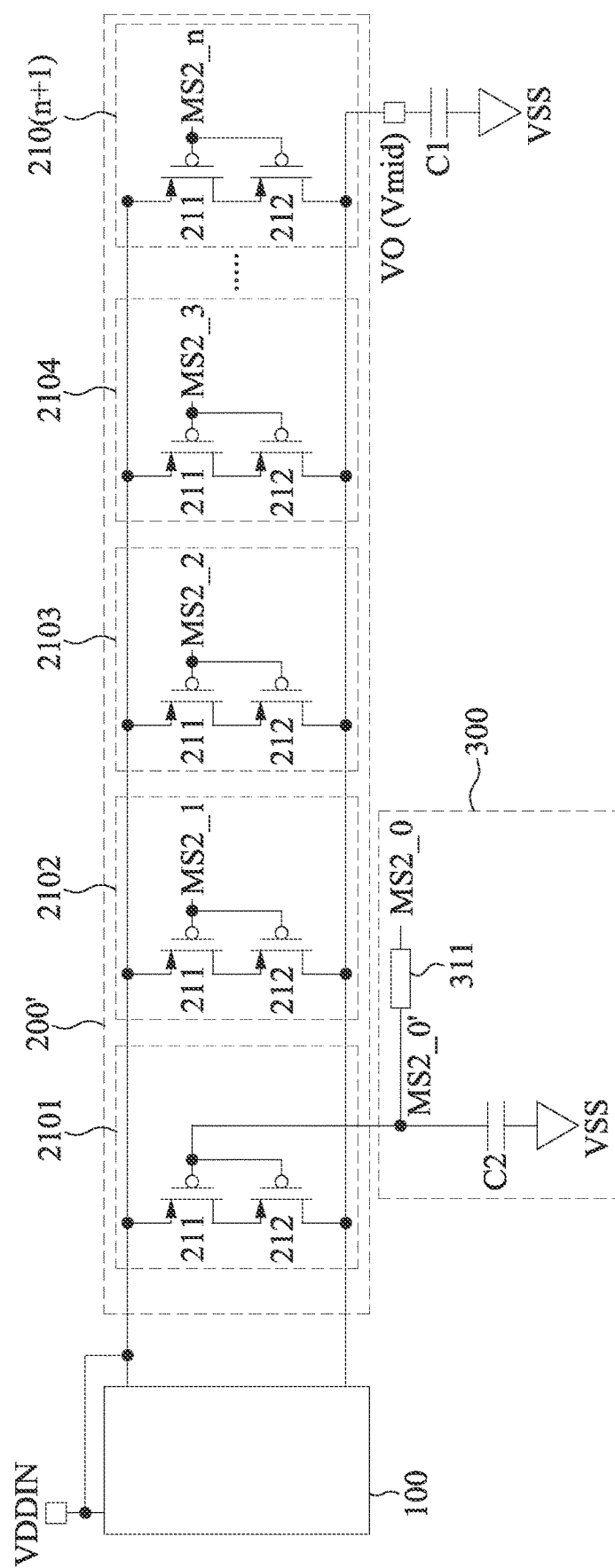
FIG. 8 is a detailed schematic diagram of a power supply generator corresponding to one in FIG. 1, in accordance with another embodiment.

Reference is now made to FIG. 8. FIG. 8 is a detailed schematic diagram of a power supply generator 80 corresponding to one in FIG. 1, in accordance with another embodiment. With respect to the embodiments of FIGS. 1-7, like elements in FIG. 8 are designated with the same reference numbers for ease of understanding.

Compared with FIG. 4, instead of gates of the transistors 211-212 in the switching circuit 2101$b$ receiving the control signal MS2_0 (i.e., the control signal MS2 in FIG. 2), the gates of the transistors 211-212 in the switching circuit 2101 is coupled to the control circuit 300 configured shown in FIG. 2. As shown in FIG. 8, the resistive unit 311 in the control circuit 300 receives the control signal MS2_0 and outputs the control signal MS2_0' at one of its terminals. Accordingly, the transistors 211-212 of the switching circuit 2101 are turned on slowly in response to the control signal MS2_0'. The spike current at output terminal Z declines.

The configurations of FIG. 8 are given for illustrative purposes. Various implements are within the contemplated scope of the present disclosure. For example, in some embodiments, before one, corresponding to at least one of the switching circuits 2101-210($n$+1), of the control signals MS2_1-MS2_$n$ is inputted into the switching circuits 2101-210($n$+1), it is inputted into a control circuit configured like the control circuit 300.

Figure 9B:
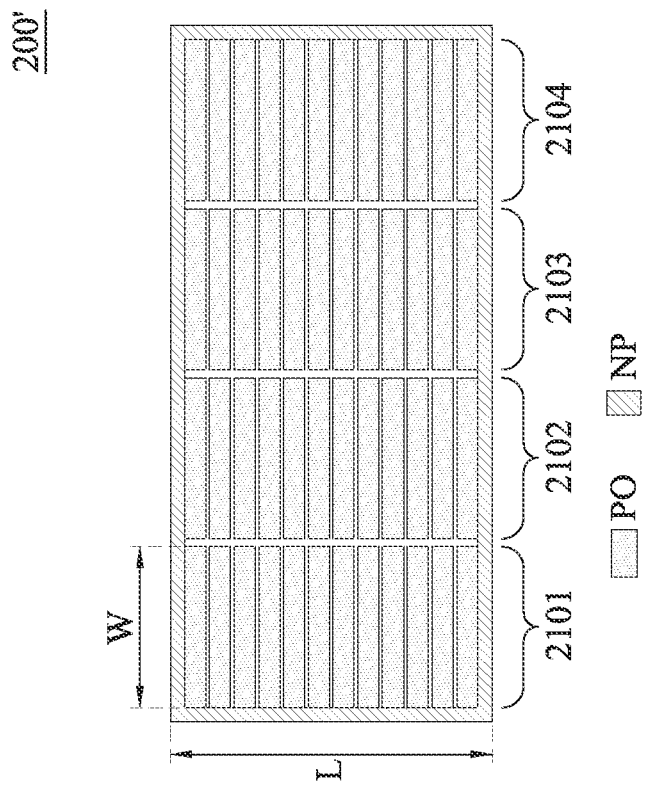
FIG. 9B is a layout diagram of a power switch circuit corresponding to one in FIG. 4, in accordance with some embodiments.
Figure 9A:
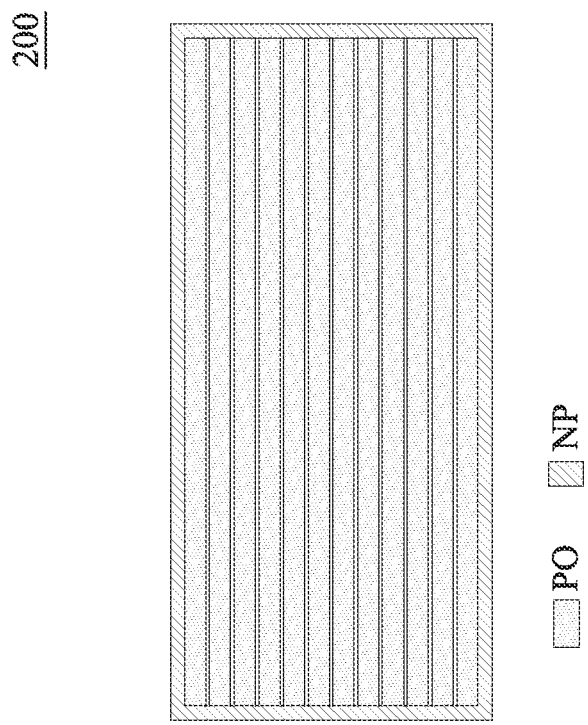
FIG. 9A is a layout diagram of a power switch circuit corresponding to one in FIG. 2, in accordance with some embodiments.

Reference is now made to FIGS. 9A-9B. FIG. 9A is a layout diagram of a power switch circuit corresponding to one in FIG. 2, in accordance with some embodiments. FIG. 9B is a layout diagram of a power switch circuit corresponding to one in FIG. 4, in accordance with some embodiments.

In some embodiments, the layout diagram of the power switch circuit 200 in FIG. 9A corresponds to the transistors 211-212 in a single switching circuit of FIG. 2. In some embodiments, the transistors 211-212 includes poly-silicon gate (PO) structures which realize their gate, and the transistors 211-212 are disposed in N+ implantation regions (NP).

In some embodiments, the layout diagram of the power switch circuit 200' in FIG. 9B corresponds to the transistors 211-212 in four switching circuits (for example, the switching circuits 2101-2104) of FIG. 4. In some embodiments, each one of the four switching circuits is disposed in one region in the layout diagram, in which the region has a length L and a width W. In some embodiments, the ratio of the width W and the length L ranges from about 0.3 to about 0.8.

In some embodiments, the deviation of an area in the layout diagram occupied by transistors corresponding to a single switching circuit and an area in the layout diagram occupied by transistors corresponding to multiple switching circuits is less than 1%.

The configurations of FIGS. 9A-9B are given for illustrative purposes. Various implements are within the contemplated scope of the present disclosure. For example, in some embodiments, an area in the layout diagram occupied by transistors corresponding to all switching circuits in FIG. 4 is the same as an area in the layout diagram occupied by transistors corresponding to the single switching circuit in FIG. 2.

Reference is now made to FIG. 10. FIG. 10 is a flow chart of a method 1000 of operating the power supply generator 10, 40 or 80, in accordance with some embodiments. It is understood that additional operations can be provided before, during, and after the processes shown by FIG. 10, and some of the operations described below can be replaced or eliminated, for additional embodiments of the method. The order of the operations/processes may be interchangeable. Throughout the various views and illustrative embodiments, like reference numbers are used to designate like elements. The method 1000 includes operations 1010-1030 that are described below with reference to the power supply generator 10 in FIG. 2 and the power supply generator 80 in FIG. 8.

In operation 1010, in response to the output signal VO having a first voltage level, for example, half of the supply voltage VDDIN, the logic state of the control signal MS in FIG. 2 changes from a logic state having the logic value 0 to a logic state having the logic value 1 at a transition time of the power supply generator 10, in which the transition time is the time T3 in the FIGS. 3A-3C, indicating the time the voltage regulator circuit 100 in the power supply generator 10 changing from being activated to being turned off.

In operation 1020, as shown in FIG. 2, a first terminal of the resistive unit 311 receives the control signal MS2 associated with the control signal MS, and a second terminal of the resistive unit 311 generates the control signal MS2' to pull down, according to the control signal MS2', a gate voltage of the transistors 211-212. In some embodiments, the capacitive unit C2 is coupled to the second terminal of the resistive unit 311.

In operation 1030, as shown in FIGS. 2 and 3A, the output voltage is pulled up by the transistors 211-212 to have a second voltage level (for instance, the supply voltage VDDIN as shown in FIG. 3A) different from the first voltage level (i.e., VDDIN/2) at a turn-on time (i.e., the time T4 in FIGS. 3A-3C) of the transistors 211-212.

In some embodiments, the method 1000 further includes, as shown the time T2 in FIG. 5A, in response to the output signal VO, having a third voltage level (i.e., the output voltage Vmid smaller than the supply voltage VDDIN at the time T2 shown in FIG. 5A), fed back to the detection circuit 400, the detection circuit 400 generates the control signal MS2_1 to turn on the transistors included in the switching circuit 2102, as shown in FIG. 8. The transistors included in the switching circuit 2102 and the transistors included in the switching circuit 2101 are coupled in parallel.

Moreover, in some embodiments, the method 1000 further includes, as shown the time T3 in FIG. 5A, in response to the output signal VO, having a fourth voltage level (i.e., the output voltage Vmid at the time T3 in FIG. 5A, being between the supply voltage VDDIN and the output voltage Vmid at the time T2), fed back to the detection circuit 400, the detection circuit 400 generates the control signal MS2_2 to turn on the transistors included in the switching circuit 2103, as shown in FIG. 8. The transistors included in the switching circuit 2103 and the transistors included in the switching circuits 2101-2102 are coupled in parallel. In some embodiments, the logic state of the control signals MS2_1-MS2_2 having the logic value 0 is different from the logic state which corresponds to the output voltage Vmid and has the logic value 1.

In some embodiments, the method 1000 further includes detecting, by the detection circuit 400, the output signal VO to generate multiple control signals MS2_1-MS2_n, and in response to the control signal MS2_1 of the control signals MS2_1-MS2_n, turning on one of the switching circuits 2102-210(n+1), for example, the switching circuit 2102. The switching circuits 2102-210(n+1) is coupled in parallel with the transistors 211-212 included in the switching circuit 2101. The method 1000 further includes in response to the rest (i.e., the control signals MS2_2-MS2_n) of the control signals MS2_1-MS2_n, turning off the rest (i.e., the switching circuits 2103-210(n+1)) of the switching circuits 2102-210(n+1).

As described above, the power supply generator includes control circuits by which a time difference between a transition time of the power supply generator and a turn-on time of a power switch circuit therein is provided, and it causes the power switch circuit to turn on slowly. Accordingly, the spike current generated as the power switch circuit is turned on massively declines.

In some embodiments, a device includes a voltage regulator circuit configured to pull up a voltage at an output terminal to equal to half of a supply voltage; multiple first transistors coupled between the output terminal and a voltage terminal providing the supply voltage; and a control circuit configured to pull down gate voltages of the first transistors from the supply voltage to a voltage level between the supply voltage and a ground voltage at a first time. The first transistors are configured to pull up the voltage at the output terminal to the supply voltage at a second time T4. In some embodiments, the control circuit includes a resistive unit having a first terminal to receive a first control signal and a second terminal to output a second control signal according to the first control signal to pull down the gate voltages of the first transistors; and a capacitive unit coupled between the second terminal of the resistive unit and a ground voltage terminal. In some embodiments, the first transistors are P conductivity type transistors coupled in series with each other between the output terminal and the voltage terminal. The control circuit includes a resistive unit configured to transmit, in response to a first control signal, a second control signal to gates of the first transistors; and a capacitive unit coupled between the gates of the first transistors and a ground voltage terminal. In some embodiments, the device further includes multiple switching circuits each including multiple second transistors coupled in series, wherein the switching circuits are coupled with each other in parallel between the output terminal and the voltage terminal. The second transistors in one of the switching circuits are configured to be turned on in response to a corresponding one of multiple first control signals different from each other. In some embodiments, the device further includes multiple inverters each configured to generate, based on the voltage at the output terminal, the corresponding one in the first control signals. Threshold voltages of the inverters are different from each other. In some embodiments, the second transistors are P conductivity type transistors. In some embodiments, the device further includes a detection circuit configured to generate, according to the voltage at the output terminal and the supply voltage, the first control signals to turned on the switching circuits. In some embodiments, the detection circuit includes a first Schmitt trigger inverter configured to generate, in response to the voltage at the output terminal having a first voltage level, a first signal of the first control signals to turn on a first circuit of the switching circuits; and a second Schmitt trigger inverter configured to generate, in response to the voltage at the output terminal having a second voltage level different from the first voltage level, a second signal of the first control signals to turn on a second circuit of the switching circuits. In some embodiments, the voltage regulator circuit is configured to operate in response to a first control signal to pull up the voltage at an output terminal, and the control circuit is configured to pull down the gate voltages in response to a second control signal. The first and second control signals have different logic values. In some embodiments, the device further includes a selection circuit configured to generate the first and second control signals in response to switching an operation mode of the device. In some embodiments, the control circuit is further configured to pull down the gate voltages of the first transistors to the ground voltage at a third time after the second time.

Also disclosed is a device includes a voltage regulator circuit including multiple first transistors configured to be turned on in a first operation mode to pull up an output voltage from a ground voltage to a first voltage level that is between the ground voltage and a supply voltage; a power switch circuit coupled in parallel with the first transistors, and configured to be turned on in a second operation mode to pull up the output voltage from the first voltage level to the supply voltage; and a detection circuit configured to generate, in response to the output voltage, multiple first control signals to turn on the power switch circuit. In some embodiments, the voltage regulator circuit and the power switch circuit are coupled with each other in parallel between an output terminal having the output voltage and a voltage terminal providing the supply voltage. In some embodiments, the power switch circuit includes multiple strings of second transistors, wherein gates of the second transistors in the strings are configured to receive the first control signals. The detection circuit includes a first inverter configured to generate a first signal of the first control signals to turn on a first string in the strings of second transistors at a first time; and a second inverter configured to generate a second signal of the first control signals to turn on a second string in the strings of second transistors at a second time different from the first time. In some embodiments, the device further includes a selection circuit configured to generate a second control signal to the power switch circuit in response to switching an operation mode of the device. The power switch circuit includes a switching circuit configured to adjust the output voltage at a first time in response to the second control signal. In some embodiments, the first voltage level equals to half of the supply voltage. The power switch circuit is further configured to pull up the output voltage from the first voltage level to a second voltage level at a second time after the first time, the second voltage level being greater than the first voltage level and less than the supply voltage.

Also disclosed is a method includes operations as below: controlling, in response to a voltage level of a terminal of at least one first transistor being smaller than a first voltage level, multiple second transistors to adjust the voltage level of the terminal of the at least one first transistor to be equal to the first voltage level; and controlling, in response to a logic state of a first control signal being changed from a first logic state to a second logic state, the at least one first transistor to be turned on gradually to pull up the voltage level of the terminal of the at least one first transistor from the first voltage level to a supply voltage. The first voltage level is equal to half of the supply voltage. In some embodiments, the at least one first transistor includes multiple strings of the first transistors coupled in parallel between a supply voltage terminal and the terminals of the first transistors in the strings. The controlling the at least one first transistor includes generating, based on the voltage level at the terminals of the first transistors in the strings, multiple control signals to gates of the strings of the first transistors to sequentially turn on the strings of the first transistors. In some embodiments, the at least one first transistor includes multiple the first transistors coupled between a supply voltage terminal and the terminals of the first transistors. The controlling the at least one first transistor includes controlling a first group in the first transistors to pull up the voltage level of the terminals of the first transistors from the first voltage level to a second voltage level greater than the first voltage level at a first time; and controlling a second group in the first transistors to pull up the voltage level of the terminals of the first transistors from the second voltage level to a third voltage level greater than the second voltage level at a second time after the first time. In some embodiments, the controlling the at least one first transistor further includes controlling a third group in the first transistors to pull up the voltage level of the terminals of the first transistors from the third voltage level to the supply voltage at a third time after the second time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a voltage regulator circuit coupled to an output terminal;
    a plurality of transistors coupled between the output terminal and a voltage terminal providing a supply voltage, wherein gate terminals of the plurality of transistors are coupled together,
    wherein when the plurality of transistors are turned off, the voltage regulator circuit is configured to charge the output terminal to have a voltage different from the supply voltage at a first time;
    a control circuit configured to adjust gate voltages of the plurality of transistors to a voltage level between the supply voltage and a ground voltage at a second time after the first time and to adjust the gate voltages of the plurality of transistors to the ground voltage at a third time after the second time for fully turning on the plurality of transistors; and
    a plurality of switching circuits coupled with each other in parallel between the output terminal and the voltage terminal, and each configured to switch on in response to a corresponding one of a plurality of control signals different from each other.

2. The device of claim 1, wherein the control circuit comprises:
    a resistive unit having a first terminal to receive a first control signal and a second terminal to output a second control signal according to the first control signal to pull down the gate voltages of the plurality of transistors at the second time; and
a capacitive unit coupled between the second terminal of the resistive unit and a ground voltage terminal.

3. The device of claim 1, wherein the plurality of transistors are P conductivity type transistors coupled in series with each other between the output terminal and the voltage terminal;
wherein the control circuit comprises:
a resistive unit configured to transmit, in response to a first control signal, a second control signal to gates of the plurality of transistors.

4. The device of claim 1, further comprising:
a plurality of inverters each configured to generate, based on a voltage at the output terminal, the corresponding one in the plurality of control signals,
wherein threshold voltages of the plurality of inverters are different from each other.

5. The device of claim 1, wherein each one in the plurality of switching circuits comprises a plurality of P-type transistors coupled in series with each other.

6. The device of claim 1, further comprising:
a plurality of inverters each configured to generate, based on a voltage at the output terminal, the corresponding one in the plurality of control signals.

7. The device of claim 1, further comprising:
a detection circuit configured to generate, according to the voltage at the output terminal and the supply voltage, the plurality of control signals to turn on the plurality of switching circuits.

8. The device of claim 7, wherein the detection circuit comprises:
a Schmitt trigger inverter configured to generate, in response to the voltage at the output terminal having a first voltage level, one of the plurality of control signals to turn on a first circuit of the plurality of switching circuits.

9. The device of claim 7, wherein a first signal in the plurality of control signals falls before a second signal in the plurality of control signals falls to the ground voltage.

10. The device of claim 1, wherein the voltage regulator circuit is configured to operate in response to a first control signal to pull up a voltage at the output terminal, and
the control circuit is configured to pull down the gate voltages in response to a second control signal,
wherein the first and second control signals have different logic values.

11. The device of claim 10, further comprising:
a selection circuit configured to generate the first and second control signals in response to switching an operation mode of the device.

12. A device, comprising:
a first transistor and a second transistor that are coupled between an output terminal and a voltage terminal providing a supply voltage;
a third transistor having a first terminal coupled to the voltage terminal, a second terminal coupled to a terminal of the first transistor, and a gate terminal coupled to the output terminal;
wherein when the second transistor is turned off in a first operation mode, the first transistor is configured to be turned on to pull up a voltage at the output terminal to a first voltage level; and
a first inverter unit configured to generate, in response to the voltage at the output terminal, a first control signal to turn on the second transistor in a second operation mode to pull up the voltage at the output terminal from the first voltage level to a second voltage level when the first transistor is turned off.

13. The device of claim 12, wherein the first voltage level is half of the second voltage level.

14. The device of claim 12, further comprising:
a fourth transistor coupled with the second transistor and configured to receive the first control signal in the second operation mode to transmit the supply voltage to the second transistor.

15. The device of claim 12, further comprising:
fourth and fifth transistors coupled between the output terminal and the voltage terminal; and
a second inverter configured to operate according to the supply voltage to generate, in response to the voltage at the output terminal, a second control signal,
wherein the fourth and fifth transistors are configured to pull up the voltage at the output terminal in the second operation mode.

16. The device of claim 15, wherein the first control signal reaches a ground voltage at a first time, and the second control signal reaches the ground voltage at a second time after the first time.

17. A method, comprising:
outputting, by a power supply generator, an output signal to have a voltage equal to half of a supply voltage at a first time when a first series of transistors are turned off and a second series of transistors are turned on,
wherein a first transistor in the second series of transistors is switched in response to the output signal,
wherein the first and second series of transistors are coupled in parallel between a supply voltage terminal providing the supply voltage and an output terminal outputting the output signal; and
outputting, by the power supply generator, the output signal to have an increasing voltage at a second time after the first time when the first series of transistors are turned on and the second series of transistors are turned off.

18. The method of claim 17, wherein the output terminal is coupled to a gate terminal of the first transistor in the second series of transistors.

19. The method of claim 17, further comprising:
generating a first control signal to an amplifier of the power supply generator to generate a second control signal to one in the second series of transistors for transmitting the supply voltage to the output terminal.

20. The method of claim 19, further comprising:
generating a third control signal to switch on the first series of transistors,
wherein the first control signal and the third control signal have different logic values.

* * * * *